United States Patent
Yamamoto et al.

(10) Patent No.: US 10,804,122 B2
(45) Date of Patent: Oct. 13, 2020

(54) SUBSTRATE HEATING APPARATUS, SUBSTRATE HEATING METHOD AND METHOD OF MANUFACTURING ELECTRONIC DEVICE

(71) Applicant: Panasonic Intellectual Property Management Co., Ltd., Osaka (JP)

(72) Inventors: Masahiro Yamamoto, Osaka (JP); Tomohiro Okumura, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 348 days.

(21) Appl. No.: 15/840,410

(22) Filed: Dec. 13, 2017

(65) Prior Publication Data

US 2018/0211855 A1   Jul. 26, 2018

(30) Foreign Application Priority Data

Jan. 23, 2017 (JP) .................................. 2017-009652

(51) Int. Cl.
  *H01L 21/67* (2006.01)
  *F24H 3/04* (2006.01)
  (Continued)

(52) U.S. Cl.
  CPC ...... *H01L 21/67115* (2013.01); *F24H 3/0405* (2013.01); *H01L 21/324* (2013.01); *H01L 21/67109* (2013.01); *H01L 21/67248* (2013.01); *H01L 21/6838* (2013.01); *H01L 21/68714* (2013.01); *H01L 21/68764* (2013.01); *H01L 23/32* (2013.01)

(58) Field of Classification Search
  CPC .................................................. H01L 21/67115
  USPC .................................................. 219/494, 490
  See application file for complete search history.

(56) References Cited

U.S. PATENT DOCUMENTS

| | | | |
|---|---|---|---|
| 5,831,248 A | 11/1998 | Hojyo et al. | |
| 2002/0125232 A1* | 9/2002 | Choo | B23K 26/046 219/121.69 |

(Continued)

FOREIGN PATENT DOCUMENTS

| | | |
|---|---|---|
| JP | 9-312269 | 12/1997 |
| JP | 2000-061677 | 2/2000 |

(Continued)

*Primary Examiner* — Lauren A Crane
(74) *Attorney, Agent, or Firm* — Wenderoth, Lind & Ponack, L.L.P.

(57) ABSTRACT

To provide a substrate heating apparatus, a substrate heating method and a method of manufacturing an electronic device having excellent uniformity at the time of processing the substrate by a linear heat source. A substrate heating apparatus including a substrate holding tool holding a substrate as a processed object, a heat source heating the substrate held by the substrate holding tool by a linear heating portion, a moving mechanism allowing the substrate holding tool and the heat source to relatively move in a direction orthogonal to a longitudinal direction of the linear heating portion of the heat source and a cooling mechanism arranged in the substrate holding tool and contacting the substrate to cool an outer peripheral portion of the substrate, in which the cooling mechanism has a distribution in cooling ability according to a position of the substrate.

10 Claims, 9 Drawing Sheets

(51) Int. Cl.
    *H01L 21/324*     (2006.01)
    *H01L 21/687*     (2006.01)
    *H01L 23/32*     (2006.01)
    *H01L 21/683*     (2006.01)

(56) References Cited

U.S. PATENT DOCUMENTS

| | | |
|---|---|---|
| 2003/0209528 A1 | 11/2003 | Choo et al. |
| 2006/0219360 A1 | 10/2006 | Iwasaki |
| 2009/0118872 A1 | 5/2009 | Nonaka et al. |
| 2010/0224355 A1 | 9/2010 | Iwasaki |
| 2013/0115780 A1 | 5/2013 | Okumura et al. |
| 2014/0220784 A1 | 8/2014 | Okumura et al. |
| 2015/0053645 A1* | 2/2015 | Okumura ........... H01J 37/32119 216/68 |

FOREIGN PATENT DOCUMENTS

| | | |
|---|---|---|
| JP | 2006-286733 | 10/2006 |
| JP | 2009-117443 | 5/2009 |
| JP | 2013-120633 | 6/2013 |
| JP | 2013-120684 | 6/2013 |
| JP | 2013-120685 | 6/2013 |

* cited by examiner

TEMPERATURE INCREASE

TEMPERATURE REDUCTION

SUBSTRATE HEATING APPARATUS, SUBSTRATE HEATING METHOD AND METHOD OF MANUFACTURING ELECTRONIC DEVICE

TECHNICAL FIELD

The technical field relates to a substrate heating apparatus, a substrate heating method and a method of manufacturing an electronic device capable of heating a substrate by using a heat source.

BACKGROUND

A process by heating a thin film formed on a substrate has been used to obtain predetermined characteristics. For example, there is a technique in which a conductive ink is printed on a flexible substrate and heated to thereby evaporate a binder contained in the ink to form electric wiring. There is also a technique in which heat is added to amorphous silicon by laser or the like to be polycrystallized as a method of forming a polycrystalline silicon film used for semiconductors or solar cells at low cost.

In order to manufacture such electronic devices at even lower cost, one can use continuous processing by a roll-to-roll method. For example, examples of continuous processing using thermal plasma are shown in JP-A-2013-120633 (Patent Literature 1), JP-A-2013-120684 (Patent Literature 2) and JP-A-2013-120685 (Patent Literature 3). According to these methods, passing processing by winding a roll while irradiating the substrate with thermal plasma, one can thereby perform processing at a high speed. These methods have advantages in that throughput is higher than batch processing such as processing by a heat treatment furnace, and equipment cost is lower than a heating apparatus by laser.

However, in a case where a substrate having a curved line in an outer shape is processed in the related-art technique, there is a phenomenon where temperature uniformity is drastically reduced at an end portion of the substrate. The phenomenon will be explained by showing a schematic view of substrate heating in related art in FIGS. 10A and 10B. When heating is performed by allowing a heat source 114 and a disc-shaped substrate 101 to relatively move, the area of the substrate 101 facing the heat source 114 changes with the relative movement of the substrate 101. The main portion to be heated in the substrate 101 is a portion facing the heat source 114. There is also a slightly preceding region that is heated in a direction in which the heat source 114 travels. This is because temperature of the substrate 101 is increased by heat transfer. The heat transfer uniformly propagates in portions close to the center of the substrate and temperature unevenness does not occur. On the other hand, in a case where an end portion of an outer periphery of the substrate is a curved line, heat capacity varies with the variation in the area of the substrate at the end portion, causing unevenness in the temperature.

For example, when the area of the substrate is reduced as shown in FIG. 10A, the heat capacity is reduced at an end portion of the substrate and the temperature is increased. In a case of a circular substrate 101 as shown in FIG. 10A, the area of a region 117 facing the heat source 114 varies with respect to the position of the heat source 114 relative to the substrate 101. After the heat source 114 passes the center of the substrate 101, the area is reduced, and a speed of the reduction of the heat capacity is increased. That is, the specific temperature increase at the end portion of the substrate gradually becomes prominent after the heat source 114 passes the center of the substrate and reaches the maximum value at a final heating point 115.

The temperature increase that the end portion of the substrate seen after the heat source 114 passes the center of the substrate is explained here. In a period until the heat source 114 reaches the center of the substrate as shown in FIG. 10B, temperature unevenness is observed at the end portion of the substrate due to the same reason. As the area of the region 117 to be heated with the travel of the heat source 114 is widened in this case, the temperature at an initial heating point 116 at an end portion of the substrate is reduced.

Such temperature unevenness becomes a variation factor in the characteristics of a substrate or a film by heat treatment, therefore, it is difficult to obtain the desired result.

SUMMARY

The present disclosure has been made in view of the above problems, and an objective thereof is to provide a substrate heating apparatus, a substrate heating method and a method of manufacturing an electronic device with excellent temperature uniformity at the time of processing the substrate by the linear heat source.

In order to achieve the above objective, a heating apparatus according to a first aspect of the present disclosure includes a substrate holding tool holding a substrate as a processed object, a heat source heating the substrate held by the substrate holding tool by a linear heating portion, a moving mechanism allowing the substrate holding tool and the heat source to relatively move in a direction orthogonal to a longitudinal direction of the linear heating portion of the heat source and a cooling mechanism arranged in the substrate holding tool and contacting the substrate to cool an outer peripheral portion of the substrate, in which the cooling mechanism has a distribution in cooling ability according to a position of the substrate.

With the above configuration, good temperature uniformity can be obtained.

In the heating apparatus according to a second aspect of the present disclosure, the cooling mechanism may be configured to increase cooling when the region to be heated in the substrate is narrowed by the relative movement of the heat source and the substrate.

According to the above configuration, the apparatus performing heat treatment to the substrate with good uniformity can be realized even in the substrate having the region where the region to be heated is narrowed.

In the heating apparatus according to a third aspect of the present disclosure, the cooling mechanism may be configured to reduce cooling ability when the region to be heated in the substrate is widened by the relative movement of the heat source and the substrate.

According to the above configuration, the apparatus performing heat treatment to the substrate with good uniformity can be realized even in the substrate where the region to be heated is widened.

In the heating apparatus according to a fourth aspect of the present disclosure, the heat source may be an inductively coupled plasma torch, and the inductively coupled plasma torch may be configured to include a dielectric member, a linear opening formed at an end portion of the dielectric member, an annular chamber surrounded by the dielectric member except the opening and communicating with the opening, a gas supply pipe introducing a gas into the chamber, coils provided in the dielectric member close to the chamber, and a high-frequency power supply connected to the coils to apply a high-frequency voltage to the coils.

According to the above configuration, the inductively coupled plasma can generate a high-temperature gas flow, therefore, the heating apparatus performing processing to the substrate with good uniformity and at high speed can be realized. As heat transfer heating by using the gas is applied, the heating apparatus does not have an optical wavelength dependence. Accordingly, good temperature uniformity can be realized.

In the heating apparatus according to a fifth aspect of the present disclosure, the heat source may be fixed and the substrate holding tool may be moved relative to the heat source.

According to the above configuration, good temperature uniformity can be realized.

A substrate heating method according to a sixth aspect of the present disclosure includes the steps of holding a substrate on a substrate holding member, moving the substrate holding member and a heat source in an orthogonal direction to a longitudinal direction of a linear heat source as a heating means, heating the substrate by the linear heat source, increasing cooling ability in a cooling mechanism in accordance with a moving direction in a region where a region to be heated in the substrate is narrowed with movement, and reducing cooling ability of the cooling mechanism in accordance with the moving direction in a region where a region to be heated in the substrate is widened with movement by using the cooling mechanism contacting the substrate to cool an outer peripheral portion of the substrate.

According to the above configuration, the substrate heating method performing heat treatment to the substrate with good uniformity can be realized.

A method of manufacturing an electronic device according to a seventh aspect of the present disclosure includes the step of heating the substrate by using the substrate heating method according to the above aspect to manufacture an electronic device.

According to the above configuration, the electronic device performing heat treatment to the substrate with good uniformity can be realized.

As described above, according to the above aspects of the present disclosure, the heating apparatus and method performing heat treatment to the substrate with good uniformity can be provided by varying the cooling ability according to the position of the substrate at the time of processing the substrate by the heat source having the linear heating portion.

DESCRIPTION OF EMBODIMENTS

Hereinafter, embodiments of the present disclosure will be explained with reference to the drawings.

Embodiment 1

Figure 1:
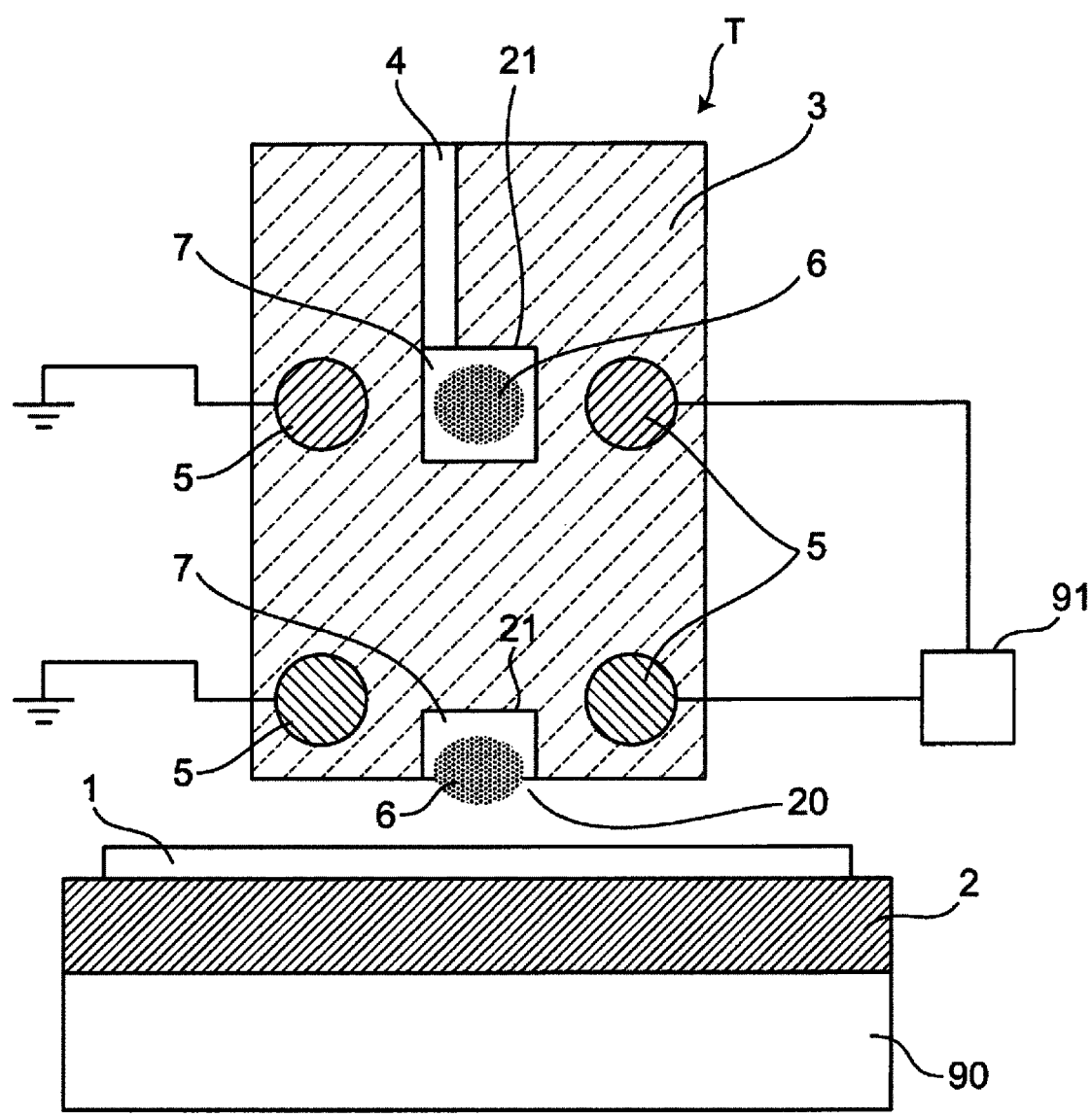
FIG. 1 is a cross-sectional view showing a heating apparatus according to Embodiment 1 of the present disclosure.
Figure 2A:
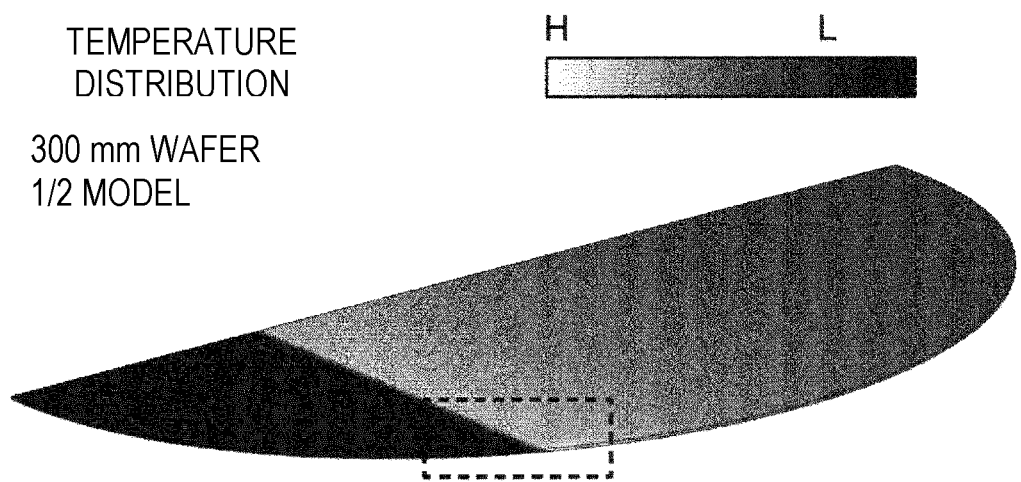
FIGS. 2A and 2B are views showing a heat transfer simulation result of substrate heating according to related art.
Figure 2B:
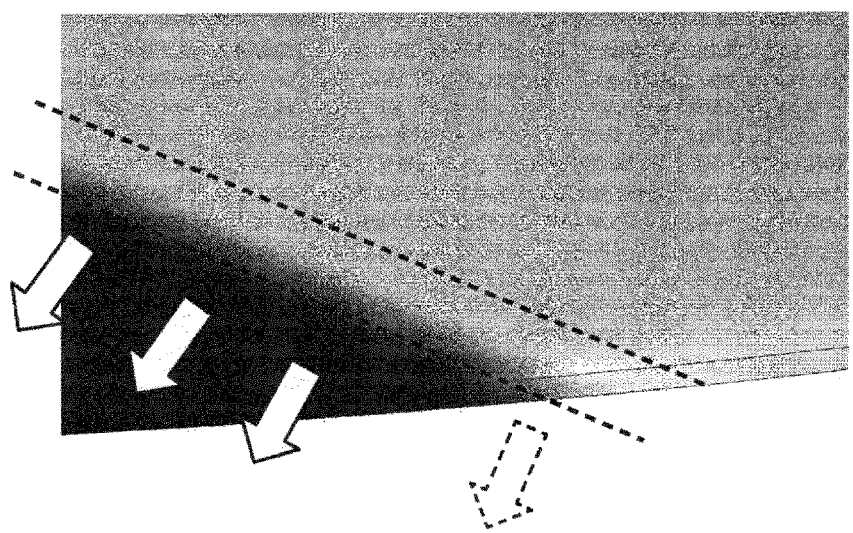
Figure 3:
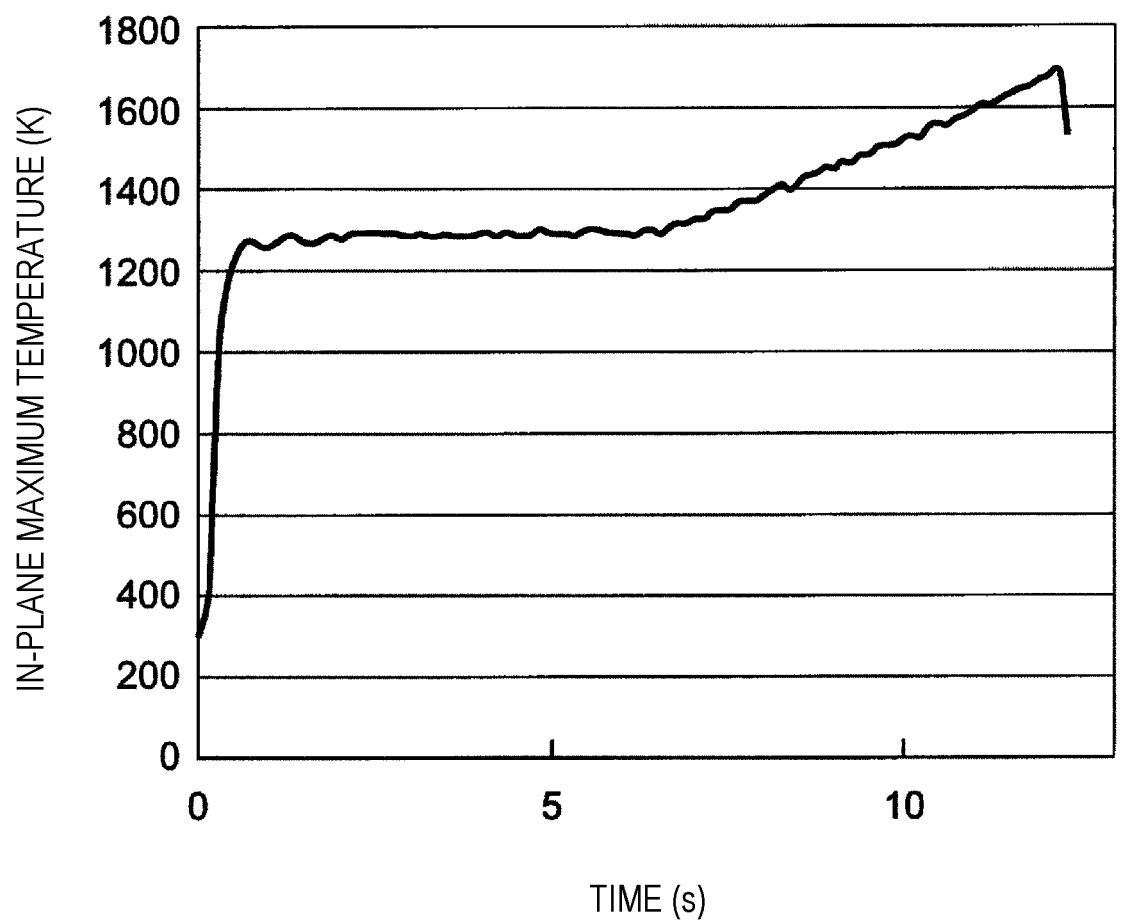
FIG. 3 is a graph showing variation with time of substrate maximum temperatures in the heat transfer simulation according to related art.
Figure 4A:
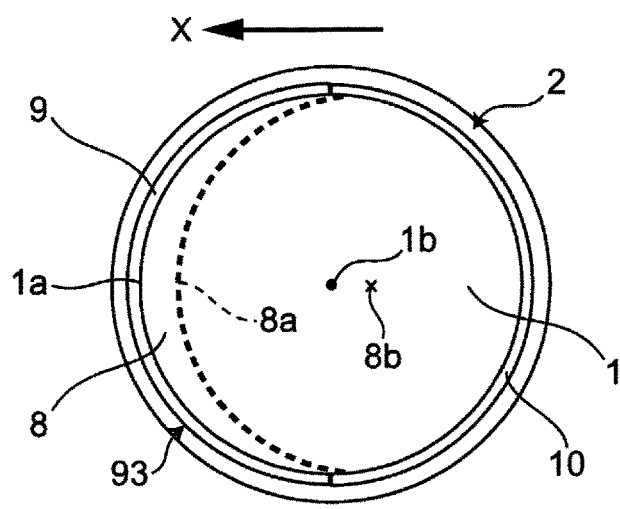
FIGS. 4A to 4C are views showing a substrate peripheral portion of the heating apparatus according to Embodiment 1 of the present disclosure.
Figure 4B:
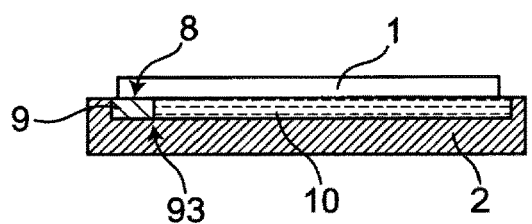

Hereinafter, Embodiment 1 of the present disclosure will be explained with reference to FIG. 1 to FIGS. 6A and 6B. FIG. 1 shows a cross section of a plasma processing apparatus as a substrate heating apparatus according to Embodiment 1 of the present disclosure. The plasma processing apparatus includes at least a substrate holder 2 as an example of a substrate holding tool, a linear heat source T, a moving mechanism 90 and a cooling mechanism 93 (FIGS. 4A-4B).

As an example of the linear heat source, an example of using an inductively coupled plasma torch T using a high frequency is shown. The inductively coupled plasma torch T includes a dielectric member 3, a linear opening 20 as an example of a linear heating portion formed at a lower end of the dielectric member 3, an annular plasma chamber made of grooves 7 formed in the dielectric member 3 and communicating with the opening 20, a gas supply pipe 4 as an example of a gas introduction port formed in the dielectric member 3 for introducing a gas into the chamber 21, high-frequency coils 5 provided in the dielectric member 3 close to the chamber 21 and a high-frequency power supply 91 connected to the high-frequency coil 5.

The chamber 21 contacting a plasma 6 of the plasma torch T is formed so as to be surrounded by the dielectric member 3 except at the opening 20. Specifically, the chamber 21 is provided with upper and lower grooves 7 for accommodating plasma 6 in FIG. 1 at a central portion and a low end of the central portion in a vertical cross section. Respective grooves 7 extend in a depth direction of the paper and have straight line portions of, for example, 100 mm or more and 400 mm or less. The two grooves 7 are connected to each other and annually continued at both end portions in the depth direction of the paper. Accordingly, the plasma 6 are annually connected and maintained while securing a current path. The lower groove 7 in FIG. 1 forms the linear opening 20 with part facing the substrate 1 being opened, and heating treatment is performed by allowing the plasma 6 to contact the substrate 1. A width dimension of the groove 7 should be determined by a high frequency. For example, when 13.56 MHz is used, 1 mm or more and 20 mm or less is preferable. The higher the frequency, the narrower a heating target region to be heated becomes, and as a result, a high-temperature plasma region is narrowed. As the region of the plasma 6 moves inside the groove 7 and becomes unstable when the groove 7 is too wide with respect to the plasma region, it is necessary to set the groove 7 to a suitable size.

The plural high-frequency coils 5 are provided in the vicinity of the chamber 21 of the dielectric member 3 and a high-frequency power supply 91 is connected to respective high-frequency coils 5. A high-frequency voltage is applied to the high-frequency coils 5 from the high-frequency power supply 91, thereby generating plasma inside the chamber 21.

A gas is introduced into the chamber 21 from the gas introduction port 4 provided, for example, at an upper part of the dielectric member 3. A pressure of the gas may be atmospheric pressure, a reduced pressure state or a pressurized state, that is, a pressure in which electric discharge is maintained may be used. In a common heating process, a pressure near atmospheric pressure is used, and Ar, a mixed gas of Ar and $H_2$ and the like are used as the gas. The gas may be changed in accordance with applications, and air, $N_2$, a mixed gas of Ar and oxygen and the like may also be used. When a length of the straight line portion of the groove 7 facing the substrate 1 in the depth direction of the paper is 300 mm, a gas flow rate is preferably 1 SLM (0.592 $Pa \cdot m^3/s$) or more and 30 SLM (177.6 $Pa \cdot m^3/s$) or less. The high-frequency power is preferably 0.5 kW or more and 150 kW or less. It is preferable that the gas flow rate or the high-frequency power is changed in proportion to the length of the straight line portion of the groove 7.

The moving mechanism 90 allows the substrate holding tool 2 and the inductively coupled plasma torch T to relatively move in a direction orthogonal to a longitudinal direction of the linear opening 20 of the inductively coupled plasma torch T. As an example, the substrate holder 2 is moved in a direction orthogonal to the longitudinal direction of the groove 7 by the moving mechanism 90 like a straight moving table that can move in one direction at a movement speed of 10 mm/s or more and 3000 mm/s or less while emitting the plasma 6 from the inductively coupled plasma torch T, thereby performing heat treatment to the substrate 1. The inductively coupled plasma torch T and the substrate holder 2 may be relatively moved, however, heating is performed by a high-temperature gas flow emitted from the opening 20 of the inductively coupled plasma torch T. When the inductively coupled plasma torch T is moved, the speed of the movement also disturbs the flow of gas. The disturbance becomes a factor in disturbing heat distribution, therefore, it is more preferable that the inductively coupled plasma torch T is fixed and the substrate holder 2 is moved.

In order to solve the problems in the related-art technique, that is, a local temperature increase seen at an end portion of the substrate 1, consideration was made by using a heat transfer simulation. A temperature distribution obtained when a Si substrate of ϕ300 mm was heated by the inductively coupled plasma torch T as a linear heat source is shown in FIGS. 2A and 2B. In the drawing, L denotes a low-temperature side and H denotes a high-temperature side. A gas temperature was set to 8000K, and heat transfer coefficients are set to a normal distribution in which σ=1.0735 and the maximum value=2140 $W/m^2 \cdot K$. These conditions of the heat source T were determined so that temperature corresponds to a substrate temperature profile during passing heating. The temperature profile was obtained by experimental results. A movement speed of the heat source T was set to 25 mm/s and heat discharge from the substrate 1 was set so that heat transfer with respect to air (300K) was 5 $W/m^2 \cdot K$ and emissivity was 0.5.

FIGS. 2A and 2B are still images at a certain point after the heat source T passes the center of the substrate 1. FIG. 2A shows the entire temperature distribution, and FIG. 2B is an enlarged view of a part indicated by dotted lines of FIG. 2A. It is found that a temperature just under the heat source is the highest and almost uniform by the linear heat source T. However, when observing FIG. 2B, a high-temperature part is seen at a substrate end portion. This is because heat transferred in a direction from the heat source T has nowhere to go and therefore accumulates at the substrate end portion. FIG. 3 shows a graph indicating the maximum temperatures at respective times in the substrate surface. The temperature at the end portion of the substrate varies as described above. Accordingly, the graph of FIG. 3 represents temperatures at positions facing the center of the heat source T until the heat source T reaches the center of the substrate 1 and represents temperatures at the end portion of the substrate 1 after the heat source T passes the center of the substrate 1. Therefore, temperature increase seen after the heat source T passes the center of the substrate represents temperature increase at the end portion. As described above, it is found that portions in the end portion to be heated later have higher temperature. The temperature increase reaches approximately 1700K at the maximum whereas a substrate processing temperature as a target of heating is approximately 1300K, which is not negligible. Also as a result of the simulation, it is found that the temperature increase profile linearly extends. As the movement speed of the heat source T is fixed, it is suggested that a correction amount of the substrate temperature is ideally proportional to the position in the substrate 1.

The substrate holder 2 incorporating the cooling mechanism 93 in which a distribution is given to cooling ability with respect to positions in the substrate 1 (distribution in which cooling ability is not uniform and the level of cooling ability varies) has been devised based on the above knowledge. A plan view of such substrate holder 2 is shown in FIG. 4A and a cross-sectional view thereof is shown in FIG. 4B. The substrate holder 2 is provided with a cooling reinforcement portion 9 and a cooling portion 10 contacting the back of the substrate 1, and the cooling reinforcement portion 9 and the cooling portion 10 configure the cooling mechanism 93.

The cooling reinforcement portion 9 is a region in which the cooling ability is increased, made of metal with high thermal conductivity such as Al or Cu, though it is not necessary to particularly limit these materials, having a function of maintaining the cooling reinforcement portion 9 in a low temperature and promoting heat exchange between the cooling reinforcement portion 9 and the substrate 1 by cooling part of the cooling reinforcement portion 9 by a well-known cooling means.

The cooling portion 10 performs cooling depending on ability of the inductively coupled plasma torch T and the target processing temperature of the substrate 1. It is not necessary to limit the material of the cooling portion 10 in the same manner as the cooling reinforcement portion 9, however, the cooling portion 10 may be made of metal such as Al or Cu as well as ceramic, quartz, synthetic resin and so on.

The difference of cooling ability in these two regions of the cooling reinforcement portion 9 and the cooling portion 10 varies depending on ability and processing conditions of the inductively coupled plasma torch T or the target processing temperature of the substrate 1 and so on. For example, when the substrate temperature is increased to approximately 1000° C. with a plasma source of 10000° C. and when the temperature of the cooling portion 10 is 20° C., a difference of approximately 1000 $W/m^2 \cdot K$ is necessary in the heat transfer coefficient. Additionally, the difference can be realized by changing the temperature of the cooling portion 10 and can be adjusted by combining with the heat transfer coefficient.

As the result of the heat transfer simulation, the cooling ability in the end portion of the substrate may be increased in the cooling reinforcement portion 9 rather than in the cooling portion 10 in proportion to the movement amount after the heat source T passes the center of the substrate 1b. That is, in FIG. 4A, the cooling ability at the substrate end portion (specifically, the cooling reinforcement portion 9) may be reinforced in proportion to coordinates in an X-direction (in other words as travelling in the X-direction) in the drawing with the substrate center 1b as an original point. According to the concept, the cooling reinforcement portion 9 is provided in a crescent-shaped cooling reinforcement region 8 formed by an arc 8a shown by a dotted line in FIG. 4A and a substrate outer peripheral portion 1a. The arc 8a shown by the dotted line has the same radius as that of the substrate 1, which is part of a circle in which a center 8b is shifted in one X-direction (right direction in FIG. 4A). The area of the substrate 1 contacting the cooling reinforcement portion 9 can be in approximately direct proportion to X-coordinates with the above simple shape. The crescent-shaped cooling reinforcement region 8 is an example of a region where the region to be heated in the substrate 1 is narrowed with movement of the movement mechanism 93.

Figure 4C:
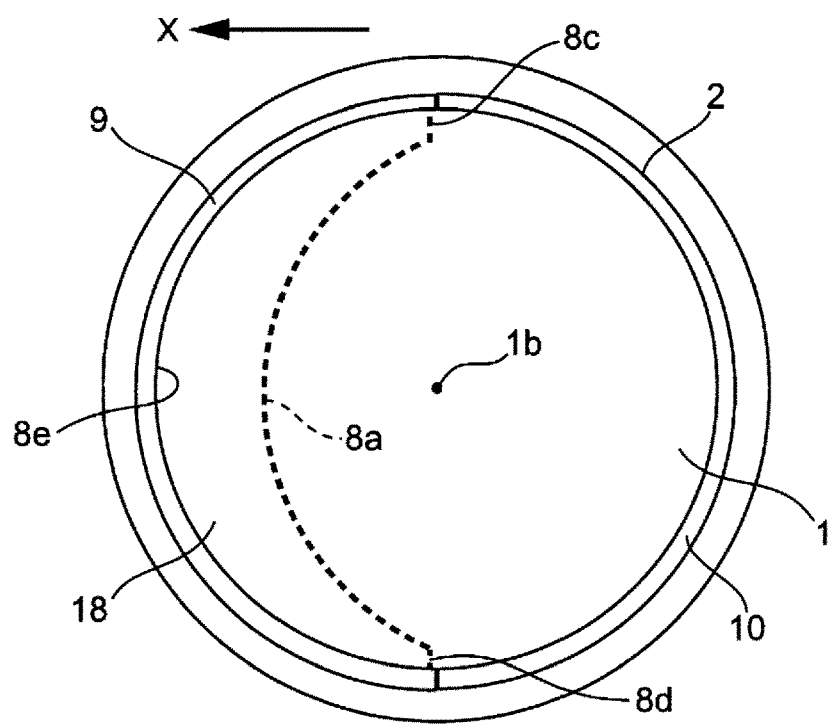

More preferably, a region 18 formed by two straight lines 8c and 8d passing the center 1b of the substrate 1 and two arcs 8a and 8e as shown in FIG. 4C is set as another example of the cooling reinforcement region 8, and the cooling reinforcement portion 9 is provided in a portion corresponding to the region 18, thereby performing temperature correction further accurately. The reason thereof is as follows. Though temperature increase in the end portion of the substrate is generated from a portion in the vicinity of the two straight lines 8c and 8d in FIG. 4C, the cooling reinforcement is not adequate in the structure of FIG. 4A. In contrast, the cooling reinforcement portion 9 is provided in the vicinity of the two straight lines 8c and 8d in the structure of FIG. 4C, therefore, the cooling ability is further increased, and the temperature correction is performed more accurately than in the case of FIG. 4A.

In FIG. 4A, the cooling reinforcement portion 9 and the cooling portion 10 are shown so as to be wider than the substrate 1, however, they may have the same size as the substrate 1 or sizes to be hidden by the substrate 1. The same applies to a later-described cooling suppression portion 12 and the same applies to different embodiments described below.

Figure 5:
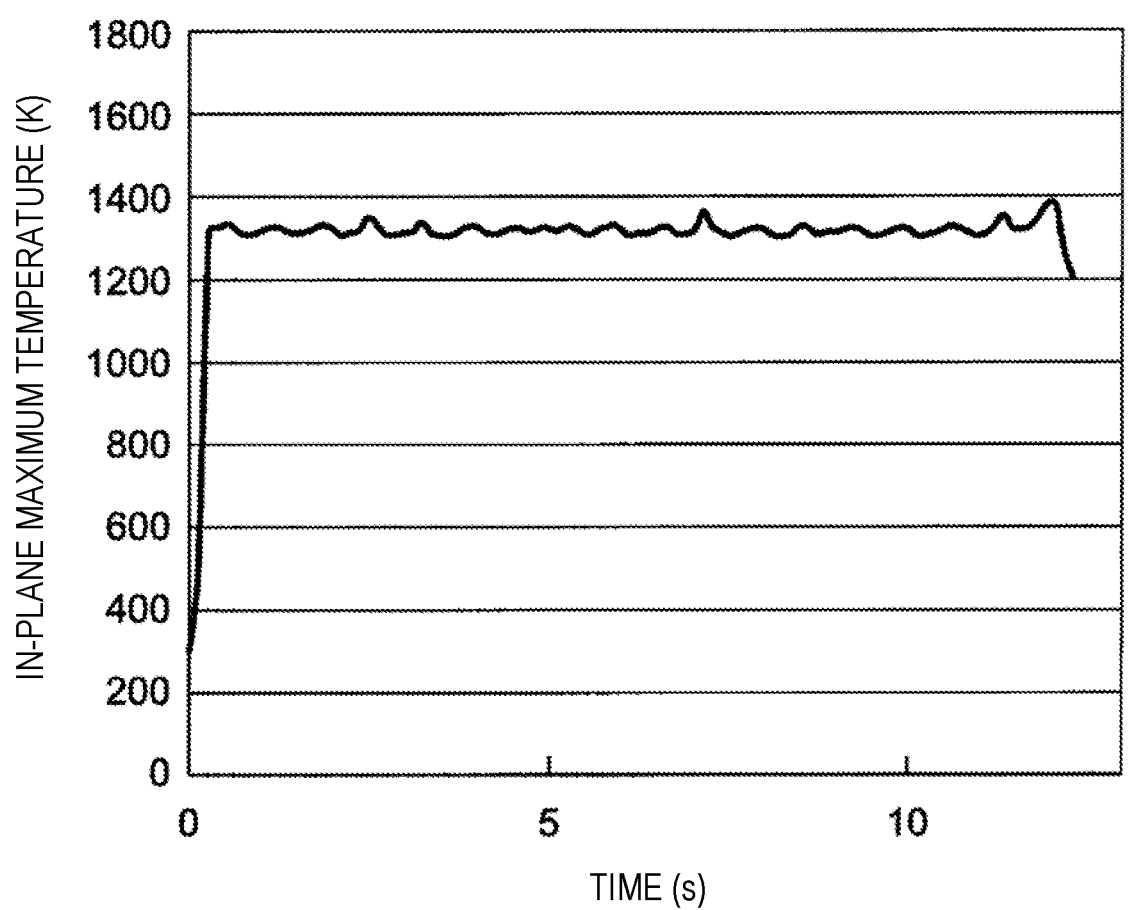
FIG. 5 is a graph showing variation with time of substrate maximum temperatures in a heat transfer simulation according to Embodiment 1 of the present disclosure.
Figure 6A:
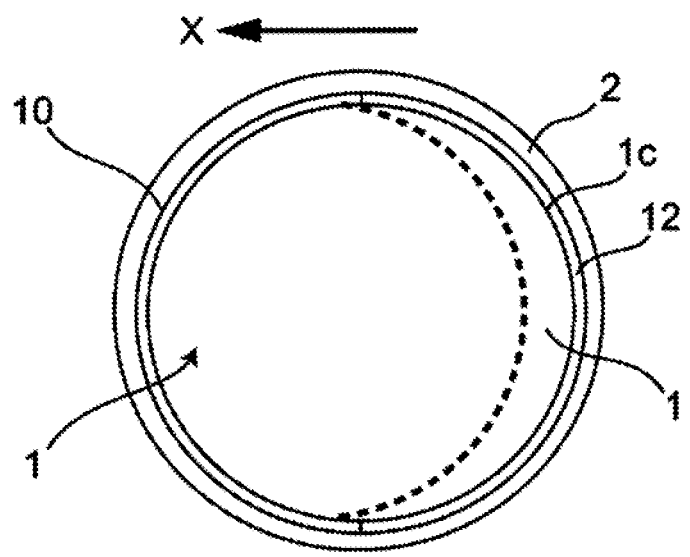
FIGS. 6A and 6B are views showing different states of a substrate peripheral portion of the heating apparatus according to Embodiment 1 of the present disclosure.
Figure 6B:
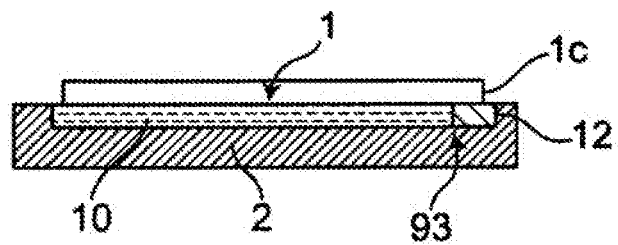

The heat transfer simulation has been made in the manner as described above concerning effects obtained in a case where heat transfer coefficients of contact heat transfer were set to 300 W/m$^2$·K in the cooling portion 10 and set to 5000 W/m$^2$·K in the cooling reinforcement portion 9 and the temperature was set to 300K in both portions in the structure shown in FIG. 4A. Results are shown in FIG. 5. It is found that the maximum temperatures in the substrate surface are maintained to be constant as compared with the case of FIG. 3. The combination of the temperature and the heat transfer coefficient in the cooling portion 10 shown here is an example and is not particularly limited. The combination also varies according to the temperature or the movement speed of the heat source T as well as the processing temperature of the substrate. The heat transfer coefficients may be changed according to, for example, the material, the surface state or the like of the cooling portion 10 or the cooling reinforcement portion 9. When a mechanism for changing respective temperatures of the cooling portion 10 and the cooling reinforcement portion 9 independently is provided, adjustment ability is further improved. These control means are not also particularly limited. Furthermore, there is a case where the adjustment can be made by radiation, contact heat transfer, heat transfer to peripheral gases or the like without providing a positive cooling means according to heat treatment conditions as long as the difference is made in heat quantities flowing out from the substrate 1.

As the cooling should be reinforced after the heat source T passes the center of the substrate 1, in the case where an outer shape of the cooling reinforcement region 8 is formed by using two arcs 8a and 8e having the same radius as shown in FIG. 4C, it is preferable that portions connecting the two arcs 8a and 8e are two straight lines 8c and 8d passing the substrate center 1b. However, temperature increase at the end portion of the substrate is "0 (zero)" at a moment when the heat source T passes the substrate center 1b, therefore, a length of the straight lines 8c and 8d should be originally "0 (zero)". As a result of considering the contradiction by using a heat transfer simulation, the actual substrate 1 changes position to a certain degree, and heat input has a distribution as the substrate 1 is thermally expanded, it is found that an appropriately good correction can be obtained when a distance between centers of the two arcs 8a and 8e is set to 3 mm or more and 15 mm or less.

Though the circular substrate 1 as an example of a base material has been explained here, the same phenomenon occurs when a substrate in which the area to be heated varies when facing the heat source T. In this case, the temperature can also be uniform in the same manner by designing the cooling reinforcement portion 9 so as to correspond to the outer shape of the substrate. Also, the method of correcting the temperature increase at the end portion of the substrate seen after the heat source passes the center of the substrate has been explained here, and the temperature at the end portion of the substrate is reduced before the heat source reaches the center of the substrate due to the same reason. In such a case, it is preferable that the crescent-shaped cooling suppression portion 12 as shown in FIG. 6 is provided conversely.

The cooling suppression portion 12 is a region for positively reducing cooling ability. As the cooling ability can be adjusted by the temperature and the heat transfer coefficient such as the cooling reinforcement portion 9, the cooling suppression portion 12 can be made of ceramic, quartz or the like with a low heat transfer coefficient. The cooling suppression portion 12 can also be a space with no member installed so that the substrate 1 is exposed to air. In the case where the cooling suppression portion 12 is allowed to fulfil its function more positively, a case of heating the portion can be considered.

The cooling ability in the cooling suppression portion 12 is reduced to be lower than the cooling ability of the cooling portion 10 as described above, thereby suppressing heat output, for example, in an end portion 1c of the substrate in a reverse direction of the moving direction, that is, in the end portion 1c of the substrate on the right side in FIG. 6 and increasing the temperature, as a result, the temperature uniformity in the entire substrate is improved and the substrate 1 can be heat-treated with good uniformity.

As described above, when using the substrate heating apparatus according to Embodiment 1 of the present disclosure, the distribution is given to cooling ability according to the position of the substrate 1 at the time of processing the substrate 1 by the heat source T having the linear heating portion 20, thereby performing heat treatment to the substrate 1 with excellent temperature uniformity in the substrate surface as compared with the related-art heating apparatus.

The example in which the substrate 2 is moved while fixing the torch T has been shown in explanation of Embodiment 1, however, the same effects can be obtained by moving the torch T while fixing the substrate holder 2. Also, the example in which the thermal plasma is used as the plasma 6 has been explained, however, the same effects can be obtained also by using non-equilibrium plasma as long as the substrate temperature is thereby increased. Furthermore, the present disclosure is not limited to just heat treatment, and can be applied to surface processes such as cleaning, planarization or crystallization and processes such as reflow, degassing or plasma doping.

The example in which the high-frequency inductively coupled plasma torch T is used as the heat source has been explained in Embodiment 1, however, the heat source is not limited to this. The same effects can be obtained also by using linear heat sources using laser, a lamp, hot air or the like.

Embodiment 2

Hereinafter, a substrate heating apparatus according to Embodiment 2 will be explained with reference to FIG. 7.

Figure 7:
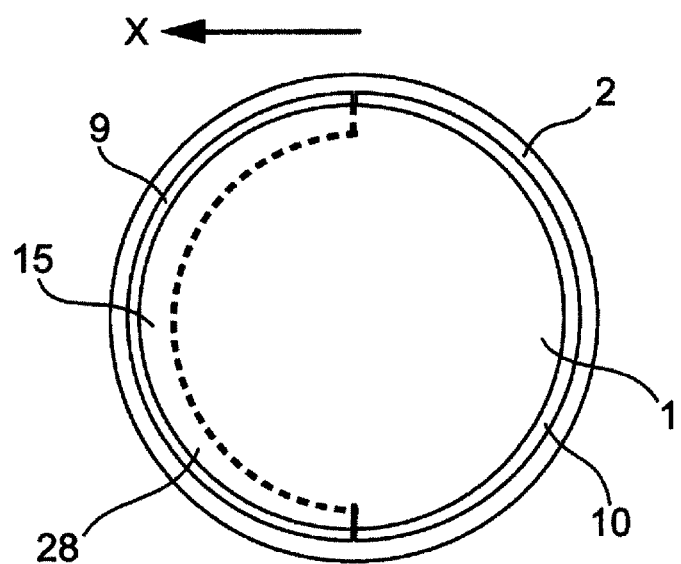
FIG. 7 is a view showing a substrate peripheral portion of a heating apparatus according to Embodiment 2 of the present disclosure.

FIG. 7 is a plan view showing the substrate holder 2 of the substrate heating apparatus according to Embodiment 2 of the present disclosure. A cooling reinforcement region 28 differs from Embodiment 1, in which a portion contacting the substrate 1 is a circular shape having the same area regardless of the position of X coordinates. Meanwhile, a distribution is given to cooling ability by changing heat transfer coefficients in accordance with the position of X coordinates. A means for changing heat transfer coefficients can be realized by, for example, changing surface roughness within a range of, for example, Ra=0.01 μm or more and 2.0 μm or less. Specifically, a final heating point 15 in FIG. 7 is set to, for example, Ra=1 μm, Ra is reduced as going away from the final heating point 15 and is set to Ra=0.01 μm at the farthest position.

As the contact area is reduced when the surface roughness is rough, the heat transfer coefficient is reduced. Accordingly, even when the contact area is the same, the cooling ability can be increased at the maximum in the final heating point 15, which can improve temperature uniformity of the entire substrate. Variation of the surface roughness can be processed by a sandblasting process as well as by nanoimprint, etching and so on. In this case, definition by the surface roughness is not appropriate but definition is given by a ratio of the area contacting the substrate to the area of the surface. In this case, the ratio is preferably 0.5% or more and 100% or less. Higher ratios do not have particular problems. When the ratio is lower than the above, mechanical strength may be insufficient according to the material and there is a danger of breakage due to distortion at the time of heating processing or due to contact with the substrate.

Here, the cooling reinforcement portion 9 can be used while performing heat exchange with a cooling means. As a specific configuration example of the cooling reinforcement portion 9, a cooling pipe such as a water-cooling pipe is fixed by welding or the like to thereby cool the substrate 1. However, the water-cooling pipe is not capable of being installed in a portion having a small area, and it may be difficult to obtain desired cooling ability. In the case of Embodiment 2, the area taken is in a certain degree uniform, therefore, uniform cooling can be performed to the entire surface.

Embodiment 3

Hereinafter, a substrate heating apparatus according to Embodiment 3 of the present disclosure will be explained with reference to FIG. 8.

Figure 8:
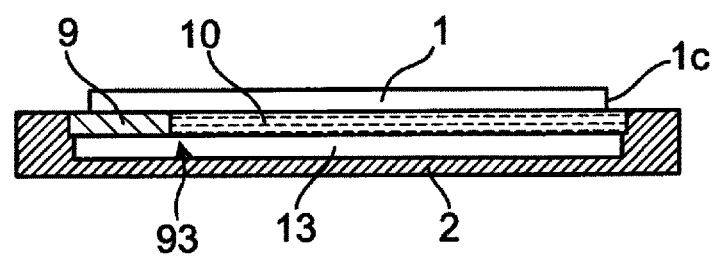
FIG. 8 is a view showing a substrate peripheral portion of a heating apparatus according to Embodiment 3 of the present disclosure.

FIG. 8 is a cross-sectional view of the substrate holder 2 of the substrate heating apparatus according to Embodiment 3 of the present disclosure. The substrate holder 2 is provided with an electrostatic attraction mechanism 13, which can attract the substrate 1 to the substrate holder 2.

According to the above, adhesion between the substrate 1 and the cooling reinforcement portion 9 as well as the cooling portion 10 can be improved. Generally, the contact heat transfer obtained when two members contact each other depends on a contact pressure. When the members are strongly pushed, a heat transfer coefficient is increased. Even when the surface roughness of the members differs, the difference between heat transfer coefficients is reduced when the contact pressure is not sufficient, and it is difficult to make a difference effectively.

In the structure according to Embodiment 3 of the present disclosure, it is possible to increase the contact pressure between the substrate 1 and the cooling reinforcement portion 9 as well as the cooling portion 10 by the electrostatic attraction mechanism 13 attracting the substrate 1 to the substrate holder 2. Accordingly, in-plane distribution of heat transfer coefficients can be emphasized and the substrate temperature is easily corrected. The attraction means is not limited to electrostatic attraction but, for example, vacuum attraction may be used. However, attraction holes are necessary both in the cooling reinforcement portion 9 and the cooling portion 10 in the case of vacuum attraction.

Here, an attraction force by the electrostatic attraction mechanism 13 is fixed regardless of the position. The difference in cooling ability can be realized on the cooling reinforcement portion side. A portion in the substrate 1 pushed to the cooling reinforcement portion 9 can clearly reflect the difference in cooling ability in the cooling reinforcement portion 9. If the contact pressure between the cooling reinforcement portion 9 and the substrate 1 is insufficient, a gap is generated between the cooling reinforcement portion 9 and the substrate 1 and the heat transfer coefficient is reduced. Then, a space distribution of cooling abilities is lost, which is not desirable. Accordingly, such inconvenience can be solved due to the attraction force by the electrostatic attraction mechanism 13.

Embodiment 4

A substrate heating apparatus according to Embodiment 4 of the present disclosure will be explained with reference to FIGS. 9A and 9B.

Figure 9A:
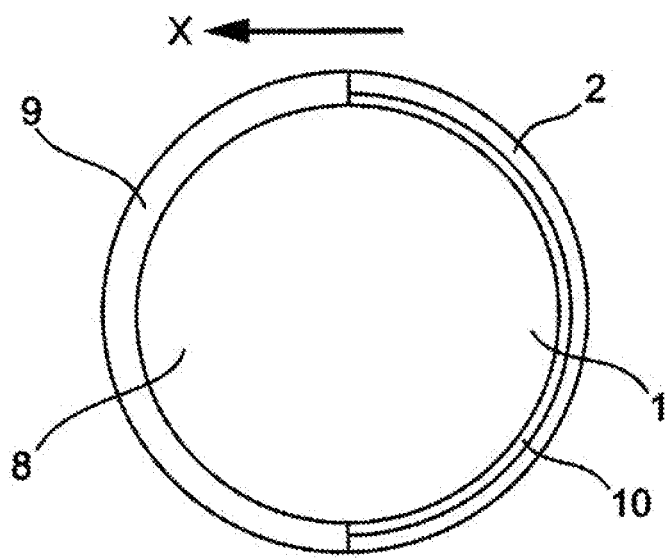
FIGS. 9A and 9B are views showing a substrate peripheral portion of a heating apparatus according to Embodiment 4 of the present disclosure.
Figure 9B:
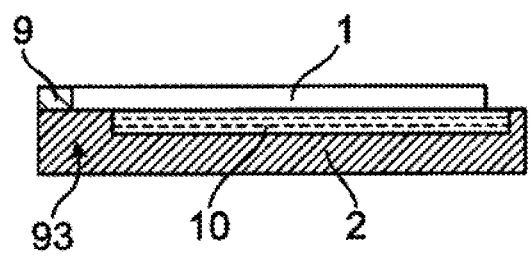
Figure 10A:
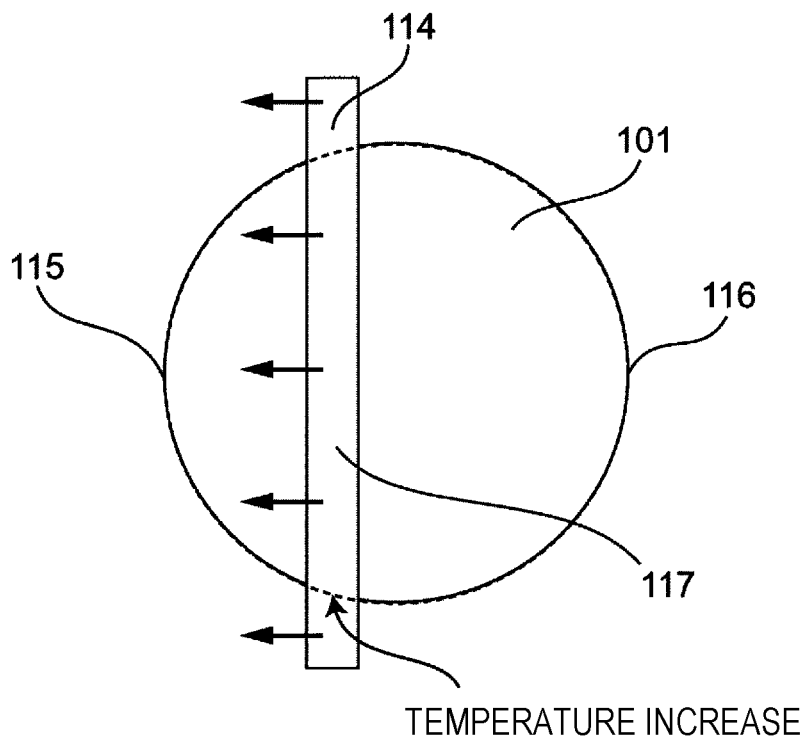
FIGS. 10A and 10B are views showing states of heating processing according to related art.
Figure 10B:
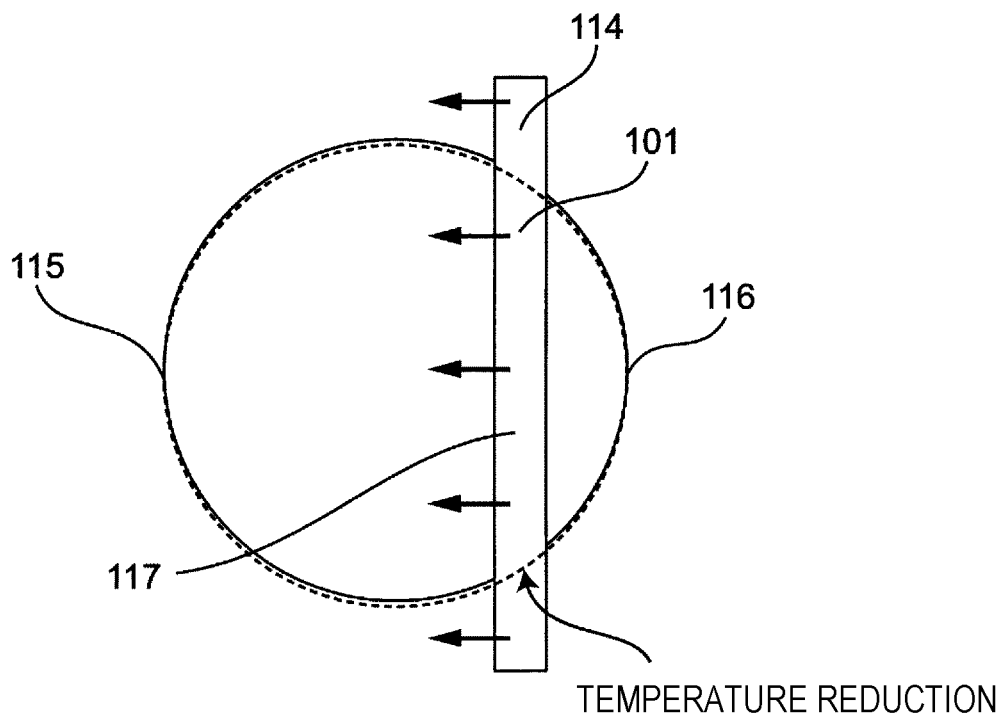

FIGS. 9A and 9B are views showing the substrate heating apparatus according to Embodiment 4 of the present disclosure. The cooling of the substrate 1 is performed from a side surface of the substrate 1 by the cooling reinforcement portion 9. The cooling ability in the cooling reinforcement portion 9 has a distribution according to the position of the substrate 1. The cooling ability is set to be the highest at the final heating point 15 as an end portion in the movement direction of the substrate 1, and the cooling ability is set to be lower at the farthest point from the final heating point 15 (for example, a starting end portion in the movement direction of the substrate 1, namely, an initial heating point at the end portion of the substrate). As means for giving the distribution, it is possible to consider that, for example, the material of the cooling reinforcement portion 9, the surface roughness of a portion contacting the substrate 1 and so on are changed. It is also possible to adopt a method of dividing the cooling reinforcement portion 9 to keep the substrate at different temperatures. A portion where deviation in temperature is the largest in the substrate 1 is an end portion of the substrate 1.

Accordingly, in order to correct the temperature more efficiently, it is preferable to adjust the temperature from a place closer to the end portion where the temperature uniformity is drastically deteriorated. That is, the temperature can be quickly corrected in a case where cooling is performed from a side surface of the end portion as compared with the case where cooling is performed from the back of the substrate 1. Accordingly, the temperature can be corrected more precisely.

In the above various embodiments or modification examples, arbitrary embodiments or modification examples are suitably combined, thereby obtaining advantages possessed by respective examples. Embodiments may be combined with each other, examples may be combined with each other, or an embodiment may be combined with an example as well as different embodiments or characteristics in examples may be combined with each other.

The substrate heating apparatus and the substrate heating method and the method of manufacturing the electronic device according to the above embodiments of the present disclosure are capable of performing heat treatment to the substrate with good uniformity by giving the distribution in cooling ability according to the position of the substrate, which can be used for crystallization, quality improvement, activating annealing and the like of semiconductors. The above embodiments of the present disclosure can be also applied to surface processes such as cleaning and planarization and processes such as reflow, degassing and plasma doping in various thin films.

What is claimed is:

1. A substrate heating apparatus comprising:
a substrate holding tool holding a substrate as a processed object;
a heat source having a linear heating portion heating the substrate held by the substrate holding tool; and
a moving mechanism allowing relative movement between the substrate holding tool and the heat source in a direction orthogonal to a longitudinal direction of the linear heating portion of the heat source,
wherein the substrate holding tool includes a cooling mechanism arranged so as to form an upper surface of the substrate holding tool, the cooling mechanism supporting and contacting a lower surface of the substrate to cool an outer peripheral portion of the substrate,
and wherein the cooling mechanism has a distribution in cooling ability according to a position of the substrate.

2. The substrate heating apparatus according to claim 1, wherein the cooling mechanism is configured to increase the cooling ability of the cooling mechanism in accordance with a moving direction to where a region to be heated in the substrate is narrowed during the relative movement between the substrate and the heat source by the moving mechanism.

3. The substrate heating apparatus according to claim 1, wherein the cooling mechanism is configured to reduce the cooling ability of the cooling mechanism in accordance with a moving direction to where a region to be heated in the substrate is widened during the relative movement between the substrate and the heat source by the moving mechanism.

4. The substrate heating apparatus according to claim 1, wherein the heat source is an inductively coupled plasma torch, and
the inductively coupled plasma torch includes a dielectric member, a linear opening formed at an end portion of the dielectric member, an annular chamber surrounded by the dielectric member except the linear opening and communicating with the linear opening, a gas supply pipe introducing a gas into the chamber, coils provided in the dielectric member close to the chamber, and a high-frequency power supply connected to the coils to apply a high-frequency voltage to the coils.

5. The substrate heating apparatus according to claim 1, wherein the heat source is fixed and the substrate holding tool is moved with respect to the heat source during the relative movement between the substrate holding tool and the heat source.

6. A substrate heating method comprising:
holding a substrate as a processed object on a substrate holding member, the substrate holding member including a cooling mechanism arranged so as to form an upper surface of the substrate holding member, the cooling mechanism supporting and contacting a lower surface of the substrate;
causing relative movement between the substrate holding member and a heat source in a direction orthogonal to a longitudinal direction of a linear heating portion of a linear heat source;
heating the substrate by heat generated by the heat source;
increasing cooling ability of the cooling mechanism in accordance with a moving direction in a region where a region to be heated in the substrate is narrowed with movement; and
reducing the cooling ability of the cooling mechanism in accordance with the moving direction in a region where a region to be heated in the substrate is widened with movement by using the cooling mechanism contacting the lower surface of the substrate to cool an outer peripheral portion of the substrate.

7. A method of manufacturing an electronic device comprising:
heating the substrate by using the substrate heating method according to claim 6 to manufacture an electronic device.

8. The substrate heating apparatus according to claim 1, wherein the cooling mechanism includes a cooling reinforcement portion and a cooling portion.

9. The substrate heating apparatus according to claim 8, wherein the cooling reinforcement portion includes a plurality of cooling reinforcement regions.

10. The substrate heating apparatus according to claim 8, wherein the cooling reinforcement portion has a crescent like shape bound by a first straight line, an outer arc, a second straight line and an inner arc.

* * * * *